US009171602B2

(12) United States Patent
Sluka et al.

(10) Patent No.: US 9,171,602 B2
(45) Date of Patent: Oct. 27, 2015

(54) ELECTRONIC ELEMENTS BASED ON QUASITWO-DIMENSIONAL ELECTRON/HOLE GAS AT CHARGED DOMAIN WALLS IN FERROELECTRICS

(71) Applicant: ECOLE POLYTECHNIQUE FEDERALE DE LAUSANNE (EPFL), Lausanne (CH)

(72) Inventors: Tomas Sluka, Lausanne (CH); Alexander Tagantsev, Pully (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 14/256,391

(22) Filed: Apr. 18, 2014

(65) Prior Publication Data

US 2014/0312385 A1     Oct. 23, 2014

(30) Foreign Application Priority Data

Apr. 19, 2013   (EP) .................. PCT/EP2013/058235

(51) Int. Cl.
| H01L 31/02 | (2006.01) |
| G11B 5/65 | (2006.01) |
| H01L 29/94 | (2006.01) |
| G11C 11/22 | (2006.01) |
| H01L 45/00 | (2006.01) |

(52) U.S. Cl.
CPC ................ *G11C 11/22* (2013.01); *H01L 45/04* (2013.01); *H01L 45/1206* (2013.01); *H01L 45/147* (2013.01)

(58) Field of Classification Search
CPC .. G11C 11/22; H01L 45/147; H01L 45/1206; H01L 45/04
USPC ....... 257/183.1, 288, 295, E27.104; 136/252; 428/836.1
See application file for complete search history.

(56) References Cited

U.S. PATENT DOCUMENTS

| 2005/0285171 A1* | 12/2005 | Wu et al. ........................ 257/295 |
| 2007/0069263 A1* | 3/2007 | Mizuuchi et al. ............. 257/295 |
| 2009/0010303 A1* | 1/2009 | Nagashima et al. ............ 374/16 |
| 2010/0289377 A1* | 11/2010 | Erbil et al. .................... 310/306 |
| 2011/0308580 A1* | 12/2011 | Seidel et al. .................. 136/252 |

* cited by examiner

*Primary Examiner* — Kimberly Rizkallah
*Assistant Examiner* — Brian Turner
(74) *Attorney, Agent, or Firm* — Nixon & Vanderhye, PC

(57) ABSTRACT

The present invention relates to a device including a ferroic material having a ferroelectric order parameter and including at least two domains, as well as a first and second electrode in electrical contact with the ferroic material. The device is configured to form a head-to-head polarization orientation or a tail-to-tail polarization orientation at an interface between the two domains to form a charged domain wall at said interface and between the first and second electrodes. The present invention relates to a corresponding method for operating such a device.

12 Claims, 16 Drawing Sheets

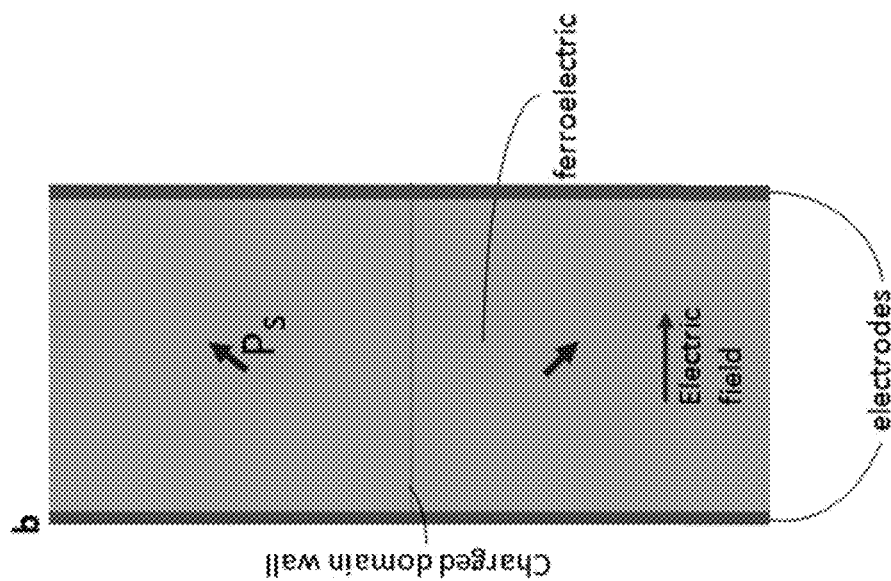
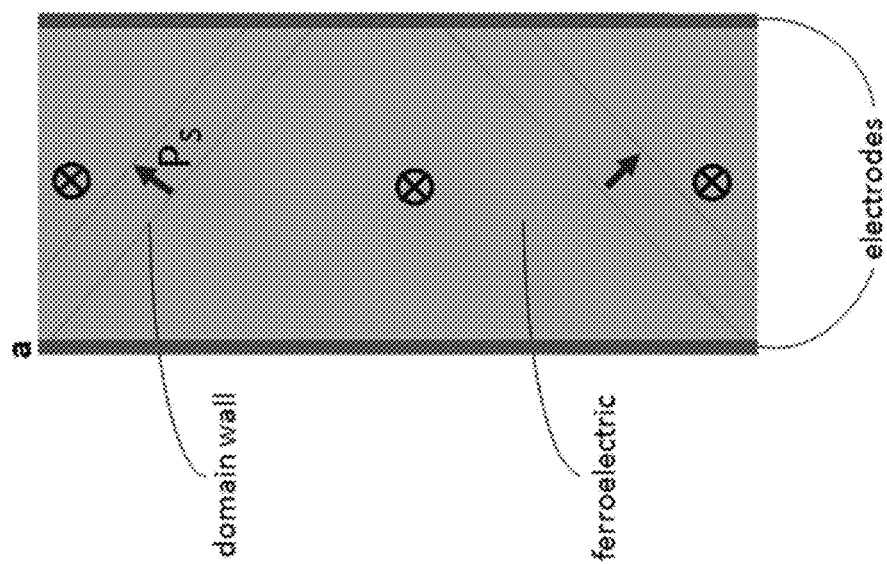
Figure 16

ELECTRONIC ELEMENTS BASED ON QUASITWO-DIMENSIONAL ELECTRON/HOLE GAS AT CHARGED DOMAIN WALLS IN FERROELECTRICS

This application claims priority to PCT/EP2013/058235 filed 19 Apr. 2013, the entire contents of which is hereby incorporated by reference.

FIELD OF THE INVENTION

The present invention relates to electronic devices based on the properties of functional interfaces. Some hetero-interfaces between two distinct transition metal oxides behave as degenerate semiconductors and form quasi-two-dimensional electron or hole gases which are used as the basic elements in oxide electronics. Specifically designed junctions between separated hetero-interfaces have the ability to form tunneling junctions and transistors [1]. In this invention the elementary building blocks of electronic elements are represented by charged domain walls in ferroelectrics.

BACKGROUND OF THE INVENTION

Contemporary electronic devices widely exploit properties of hetero-interfaces between differently doped regions in semiconductors. The doped regions are used as three-dimensional thermally activated conductors while the two dimensional interfaces between the distinctly doped regions are used as electronic junctions which provide specific volt-ampere characteristics, bias-dependent capacitance, light emission, light sensitivity etc. The hetero-junctions in semiconductors can be combined to form diodes, transistors, photonic sensors, photovoltaic cells, and related devices. Analogous properties of hetero-interfaces between some dielectric metal oxides (e.g. between $LaAlO_3$ and $SrTiO_3$) have been reported [2]. These hetero-interfaces behave as two dimensional degenerate semiconductors or conductors and display specific quantum properties due to two-dimensional confinement of free carriers. The hetero-interfaces form quasi-two-dimensional electron or hole gases [3] whose one dimensional junctions with each other were demonstrated as basic elements in oxide electronics [1]. In all the introduced cases, hetero-interfaces are spatially fixed, thus cannot be created, displaced or erased inside an existing device unless they are physically grown or destroyed.

Unlike the fixed hetero-interfaces, which often require atomic-layer precision growth, homo-interfaces in ferroics—so called domain walls—are formed between two distinct, but energetically equivalent, domain states of a single material. Thus, domain walls are in principle mobile and provide a naturally high quality structure. In ferroelectrics (a subset of ferroics), the domain walls are transition regions, typically 1-10 nm thick, between two domain states which differ in the orientation of their switchable spontaneous polarization. Ferroelectric domain walls can be moved by the electric field or by coupling forces with other order parameters whose preferred orientations are controlled by related force fields (e.g. by mechanical stress in ferroelastics, magnetic field in ferromagnets, etc.).

Natural ferroelectric domain walls are formed with head-to-tail continuity of the polarization vector across a domain wall, which results in zero net polarization charge at the domain wall. Some of these neutral domain walls show enhanced conductivity and photovoltaic response which has been proposed for memory and photovoltaic applications in the patent US 2011/308580 A1.

In contrast, the devices described in this invention are based on intrinsic properties of so called charged domain walls in ferroelectrics. Unlike neutral domain walls, the charged domain walls are regions of head-to-head and tail-to-tail net polarization divergences which accumulate large polarization charge and therefore require compensation by charged defects or free-carriers. [4-6] In typical ferroelectrics with small defect concentrations, the stability of charged domain walls depends vitally upon almost perfect free carrier compensation of their polarization charge (and partially on additional stabilization factors like ferroelastic clamping, defect pinning etc.). The existence of charged domain walls mainly in undoped and defect-free ferroelectrics may therefore be fundamentally accompanied by presence of free carriers.

For example, the free carrier concentration at charged domain walls in the prototypical perovskite ferroelectric $BaTiO_3$ reaches levels of degenerate semiconductors [6]. The free carriers form a quasi-two-dimensional electron or hole gas analogically to the oxide hetero-interfaces [2]. Hence, the polarization charge at charged domain walls effectively acts as a localized highly concentrated dopant. Unlike in heterostructures, these "quasi-doped" regions (charged domain walls) can be written, displaced, and annihilated repetitively inside a material monolith where they form mobile conductive channels. The devices described in this invention exploit also effects of the electric field on domain structures and on free carriers at charger domain walls which controls the properties of conducting channels.

SUMMARY OF THE INVENTION

Electronic elements including tunneling junctions, switches, and memory cells that are based on properties of ferroelectric charged domain walls and their boundaries with each other or other objects are described. Charged domain walls can be written, displaced and annihilated by electric field inside the material. Polarization charge introduced by charged domain walls into the material bulk effectively acts as a local dopant which induces bending of the material band structure. The present invention provides stable, artificially created and free-carrier compensated charged domain walls.

More particularly, the present invention relates to a device including:
 a ferroic material having a ferroelectric order parameter and including at least two domains; and
 a first and second electrode in electrical contact with the ferroic material;
 wherein the device is configured to form a head-to-head polarization orientation or a tail-to-tail polarization orientation at an interface between the two domains to form a charged domain wall at said interface and between the first and second electrodes.

The device is further configured to annihilate a head-to-head polarization orientation or a tail-to-tail polarization orientation at an interface between the two domains to annihilate the charged domain wall at said interface and between the first and second electrodes.

The device is further configured to spatially displace the charged domain wall within the ferroic material and outside the first and second electrodes to disable electrical contact with the first and second electrodes.

The device is configured to increase or decrease the amplitude of the charged domain wall formed at the interface of the two domains to provide field controlled impedance.

The ferroelectric material includes at least three domains forming two interconnected neutral domain walls, the charged domain wall being formed at an interconnection between the two interconnected domain walls.

The device is configured to control the size of one domain to form and annihilate the charged domain wall formed at the interface of the remaining two domains.

Device according to any previous claim, wherein the device includes third and fourth electrodes arranged to apply an electric field to the ferroic material to form the charged domain wall.

The device includes fifth and sixth electrodes to spatially displace the charged domain wall within the ferroic material and outside the first and second electrodes.

The ferroic material includes charged domain walls that are 90° domain walls, 71° domain walls or 109° domain walls, or a combination of any of these domain walls.

The present invention also relates to a switch or memory including the above mentioned device.

The present invention also relates to a method for operating an electronic device, the electronic device including a ferroic material having a ferroelectric order parameter and including at least two domains; a first and second electrode in electrical contact with the ferroic material; and third and fourth electrodes to apply an electric field to the ferroic material to form a charged domain wall.

The method includes the step of: applying an electric field via the third and fourth electrodes to form a head-to-head polarization orientation or a tail-to-tail polarization orientation at an interface between the two domains permitting charge accumulation at said interface to form a charged domain wall between the first and second electrodes.

The method further includes the step of:
changing the applied electric field via the third and fourth electrodes to increase or decrease the charge quantity of the charged domain wall and the electrical current between the first and second electrode.

The electronic device is for example a switch.

The device further including fifth and sixth electrodes to spatially displace the charged domain wall and the method further including the step of:
applying an electric field via the fifth and sixth electrodes to spatially displace the charged domain wall outside the first and second electrodes to disable electrical contact with the first and second electrodes in order to store information in the charged domain wall. The electronic device is for example a memory.

The present invention also relates to a method for operating an electronic device, the electronic device including a ferroic material having a ferroelectric order parameter and including at least two domains; a first and second electrode in electrical contact with the ferroic material; third and fourth electrodes to apply an electric field to the ferroic material to form a charged domain wall; the method including the step of:
applying an electric field via the third and fourth electrodes to form a polarization orientation at an interface between the two domains permitting charge accumulation at said interface to form a charged domain wall between the first and second electrodes; and
measuring the electrical current or potential difference across the first and second electrodes in communication with the charged domain wall to provide information about a change of the electric properties of the charged domain wall due to an external force applied to the ferroic material.

The present invention further relates to a method for operating an electronic device, the electronic device including a ferroic material having a ferroelectric order parameter and including at least two domains; a first and second electrode in electrical contact with the ferroic material; third and fourth electrodes to apply an electric field to the ferroic material to form a charged domain wall; the method including the step of:
applying an electric field via the third and fourth electrodes to form a polarization orientation at an interface between the two domains permitting charge accumulation at said interface to form a charged domain wall between the first and second electrodes; and
measuring the electrical current or potential difference across the first and second electrodes in communication with the charged domain wall to provide information about a change of the electric properties of the charged domain wall due to incident photons on the ferroic material.

The present invention also relates to a method for operating an electronic device, the electronic device including a ferroic material having a ferroelectric order parameter and including at least two domains; a first and second electrode in electrical contact with the ferroic material; third and fourth electrodes to apply an electric field to the ferroic material to form a charged domain wall; the method including the step of:
applying an electric field via the third and fourth electrodes to form a polarization orientation at an interface between the two domains permitting charge accumulation at said interface to form a charged domain wall between the first and second electrodes; and
measuring the electrical current or potential difference across the first and second electrodes in communication with the charged domain wall to provide information about a change of the electric properties of the charged domain wall due to an applied mechanical stress on the ferroic material.

BRIEF DESCRIPTION OF THE DRAWINGS

FIG. 12a shows an example of frustrated orientation between a ferroelectric crystal and a poling electric field E.

FIG. 12b shows a plate-like ferroelectric crystal with full parallel electrodes that provide homogeneous electric field when potential difference is applied between them. The crystal is oriented as introduced in FIG. 12a.

FIG. 12c shows a schematic diagram of the path defined by the electric field and temperature during frustrated poling.

FIG. 16a shows the qualitatively equivalent situation to that in FIG. 15a, but with initial domains of the opposite polarization orientation.

FIG. 16b illustrates a frustrated poling of the domain structure in FIG. 16a resulting in the formation of a tail-to-tail charged domain wall.

DETAILED DESCRIPTION

Figure 1:
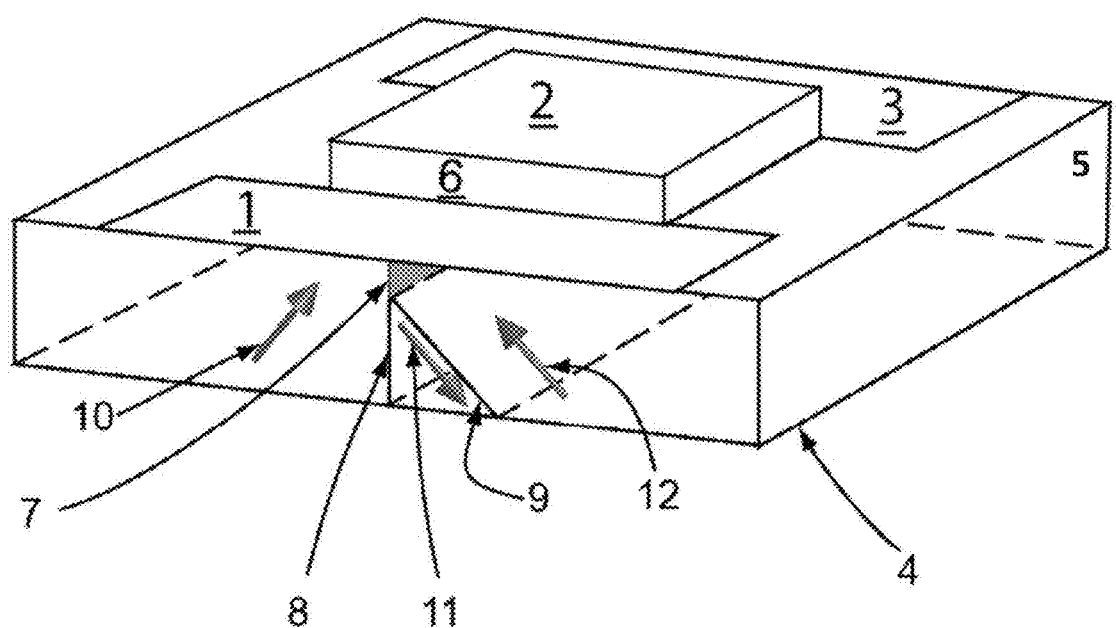
FIG. 1 shows a schematic illustration of an example electronic device which utilizes properties of ferroelectric charged domain walls.
Figure 2:
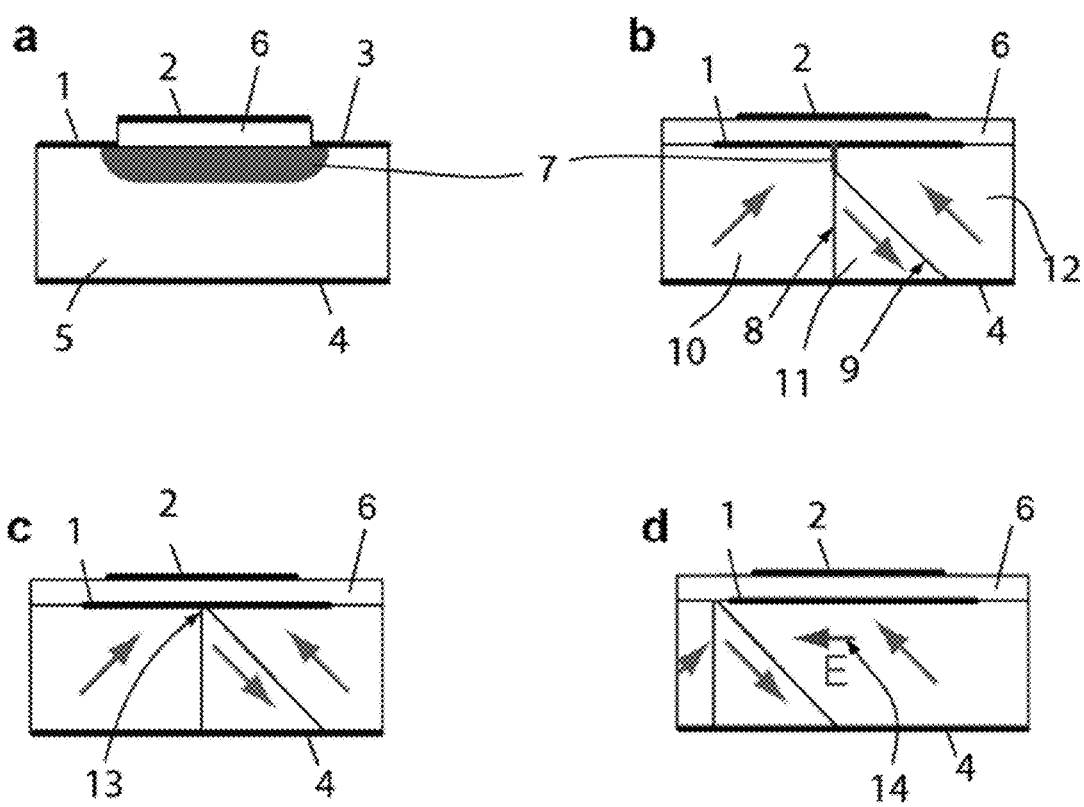
FIG. 2a is a side view of the schematic illustration in FIG. 1.
FIG. 2b is a front view of the schematic illustration in FIG. 1 in the situation when a charged domain wall is present.
FIG. 2c shows the front view of the schematic illustration in FIG. 1 in the situation without charged domain walls, but with a domain structure that includes a triple point in which a charged domain wall would appear if the out-of-plane electric field was applied.
FIG. 2d shows the front view of the schematic illustration in FIG. 1 in the situation when the domain structure is shifted out of the region covered by electrodes 1 and 3. Displacement of the domain structure is achieved by an in plane electric field 14.

Referring to FIGS. 1 and 2, an electronic device using a ferroelectric charged domain wall 7 in ferroic materials is described. The device may comprise of an electrode 4, layer of crystalline ferroelectric material 5 in crystallographic orientation which provides at least two equally preferred polarization states in respect to the electric field applied across the ferroelectric layer, two electrodes 1 and 3 located at the ferroelectric layer surface which is parallel and opposite to the electrode 4, dielectric or semiconducting layer 6 on the surface of the ferroelectric layer. The layer 6 may separate electrodes 1 and 3, and the electrode 2 located at the layer 6. The ferroelectric layer allows formation of a charged domain wall 7 by an electric field between parallel electrodes at the opposite surfaces of the ferroelectric layer.

A charged domain wall 7 is formed by an out-of-plane oriented electric field when domain structure in the ferroelectric layer includes at least one triple point 13 between domains 10, 11, and 12. The triple point is located at the cross-section of neutral domain walls 8 and 9. The electric field applied between electrode 4 and 2 controls the size of the domain 11 resulting in growth or reduction of the charged domain wall 7. FIGS. 1 and 2*a* and b show the situation when a charged domain wall 7 is formed in the vicinity of the ferroelectric layer surface. FIG. 2*c* shows the device when a charged domain wall 7 is eliminated. FIG. 2*d* illustrates the device when the domain structure composed of domains 10, 11, and 12 is moved by an in-plane electric field 14. The in-plain field can be introduced by a potential difference between additional electrodes located aside the described device. Shifting the triple point 13 from the region covered by electrodes 1 and 3 disables the possible contact between electrodes 1 and 3 and the domain wall 8 or 7. The domain structure including domains 10, 11, and 12 may also be laterally moved by other force fields like mechanical stress (for example due to different ferroelastic states of adjacent domains), which prefers domain state 12 over 10 and 11 or vice versa. A charged domain wall may respond to an electric field also by a change of its intrinsic properties, e.g. by redistribution of free carriers, which can be sensed as a change of impedance or electric potential on or between electrodes 1 and 3. This applies to the situation in which a charged domain wall is in the vicinity or in contact with the device electrodes. Intrinsic properties of a charged domain wall may be controlled also by other external forces like mechanical stress or magnetic field or by impact of incident photons and, analogically, sensed as a change of electric properties between device electrodes 1 and 3.

The device may work as a switch controlled by the potential difference between electrode 4 and 2. The switch connects electrodes 1 and 3 through charged domain wall 7. The device may work as a memory cell with information held by the position of triple point 13 inside or outside the contact with electrodes 1 and 3. The presence and intrinsic properties (controlled by various force fields or impact photons) of charged domain wall 7 and its junctions with electrodes 1 and 3 may be exhibited in the impedance characteristic of the region between electrodes 1 and 3. Thus, the device may work as a sensor or transducer of forces which control charged domain wall properties. Arrows in FIGS. 1 and 2 indicate example directions of spontaneous polarization. As illustrated, the device creates head-to-head charged domain wall. By inverting the polarization directions and the polarity of voltage between electrodes 4 and 2, the device creates analogically tail-to-tail charged domain walls resulting in analogical effects to that with head-to-head charged domain walls. A head-to-head polarization orientation or a tail-to-tail polarization orientation is a polarization orientation between domains that is non-parallel (and not head-to-tail) but is not limited to an orientation that is the 90° angle illustrated in the Figures, and, for example, can be less than or equal to 180°.

Figure 3:
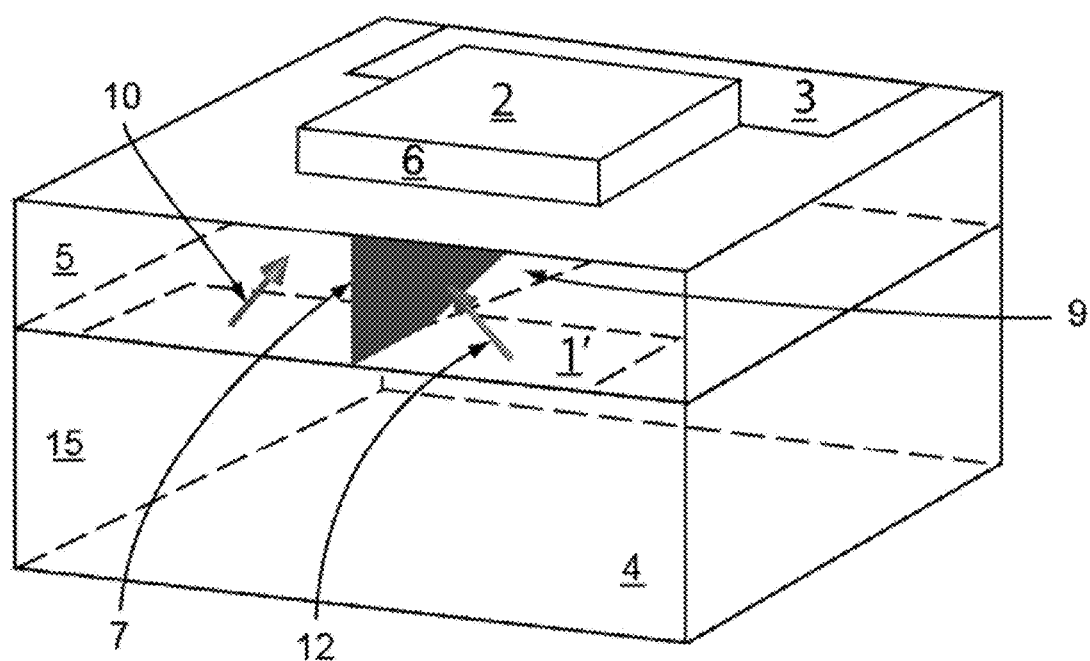
FIG. 3 shows a schematic illustration of an alternative configuration of the example electronic device from FIG. 1. Here, the electrode 1 is located at the bottom of the ferroelectric layer and marked as 1'. Layer 15 separates ferroelectric layer 5 from the electrode 4.
Figure 4:
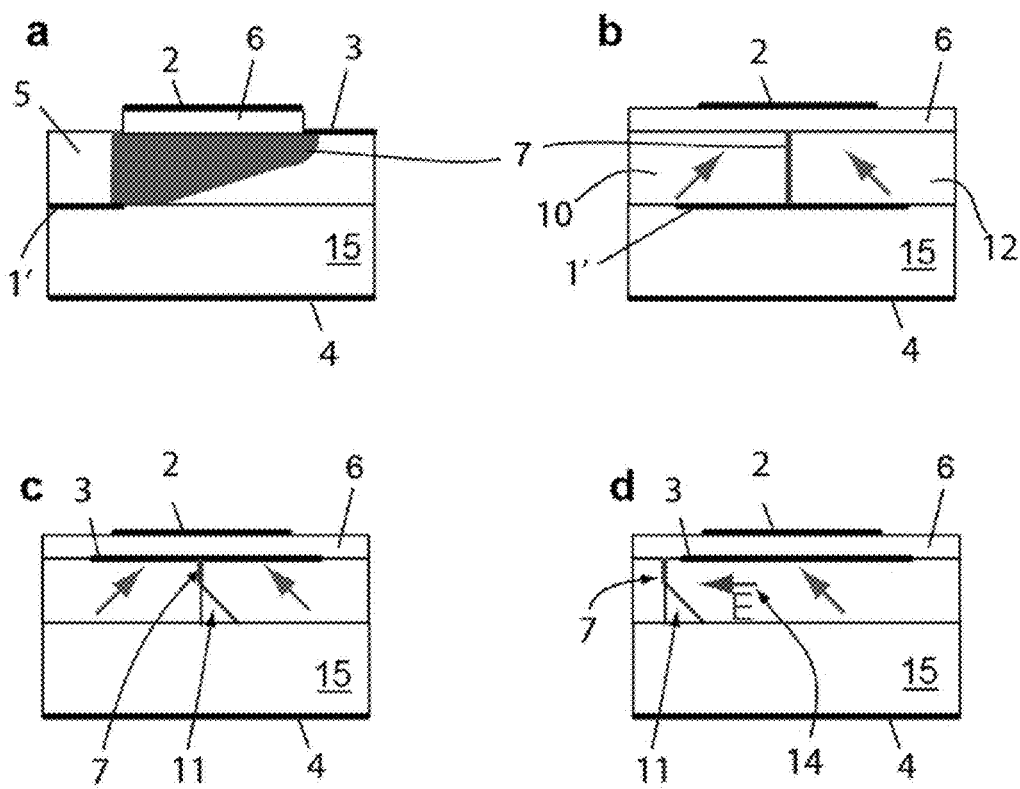
FIG. 4a is a side view of the schematic illustration in FIG. 3.
FIG. 4b is a front view of the schematic illustration in FIG. 3 in the situation when a charged domain wall crosses whole ferroelectrics layer.
FIG. 4c shows a rear view of the schematic illustration in FIG. 3 in the situation with charged domain walls only partly entering the ferroelectric layer.
FIG. 4d shows the rear view of the schematic illustration in FIG. 3 in the situation when the domain structure is shifted out of the region covered by electrodes 1' and 3. Displacement of the domain structure is achieved by an in plane electric field 14.

Referring to FIGS. 3 and 4, an alternative exemplary configuration of device from FIGS. 1 and 2 is described. The device may comprise of an electrode 1' located at the side of the ferroelectric layer which is opposite to the electrode 3 and layer 6. The ferroelectric layer and electrode 1' may be located on top of a substrate layer 15. The electrode 4 may be placed on the opposite side of the layer 15 in respect to the ferroelectric layer 5.

The depicted configurations in FIGS. 1-4 represent examples that illustrate alternative ways of exploiting the same effect—the field controlled formation and properties of charged domain wall 7 which is sensed by electrodes 1 and 3 (or 1' and 3). Additional alternative configurations of the device may be therefore formed (for example both electrodes 1 and 3 on the opposite side of the ferroelectric layer than in FIG. 1).

In order to explain the mechanisms and function of the invented device, the description of charged domain wall formation and properties are introduced hereafter. Although the description of the invention introduces some details for purpose of clarity of understanding, it will be apparent that certain changes and modifications may be practiced within the scope of the invention. For example, ferroelectric charged domain walls in the description are stabilized by ferroelastic clamping of adjacent ferroelastic domain states. However, in the broader context, the stabilization may be provided by other mechanisms while the function of charged domain walls is preserved. The present embodiments are to be considered as illustrative and not restrictive, as the invention is not to be limited to the details given herein.

Embodiments described herein include ferroic materials with ferroelectric charged domain walls and related devices. The defining characteristic of ferroic materials is an order parameter that has several energetically equivalent orientations. The orientation of an order parameter can be selected by an applied field. The order parameter in ferroelectrics is the spontaneous polarization. Ferroelectric materials may exhibit other ferroic order parameters (spontaneous strain in ferroelastics, spontaneous magnetization in ferromagnets and antiferromagnets, etc.) which may be coupled with the spontaneous polarization. The orientation of spontaneous polarization can be switched by the electric field or by coupling forces with other order parameters whose orientations are controlled by the related force fields (mechanical stress in ferroelastics, magnetic field in ferromagnets and antiferromagnets, etc.). A ferroic material may have several differently oriented regions, separated by domain walls, which coexist in a sample. Charged domain walls are a subset of ferroic domain walls. Charged domain walls exhibit nonzero net divergence of spontaneous polarization inside the domain wall region. Formation, displacement, and deletion of ferroelectric charged domain walls in ferroics may be controlled by forces (electrostatic, magnetic, mechanical, etc.) introduced at the boundaries of a ferroic sample.

Figure 5:
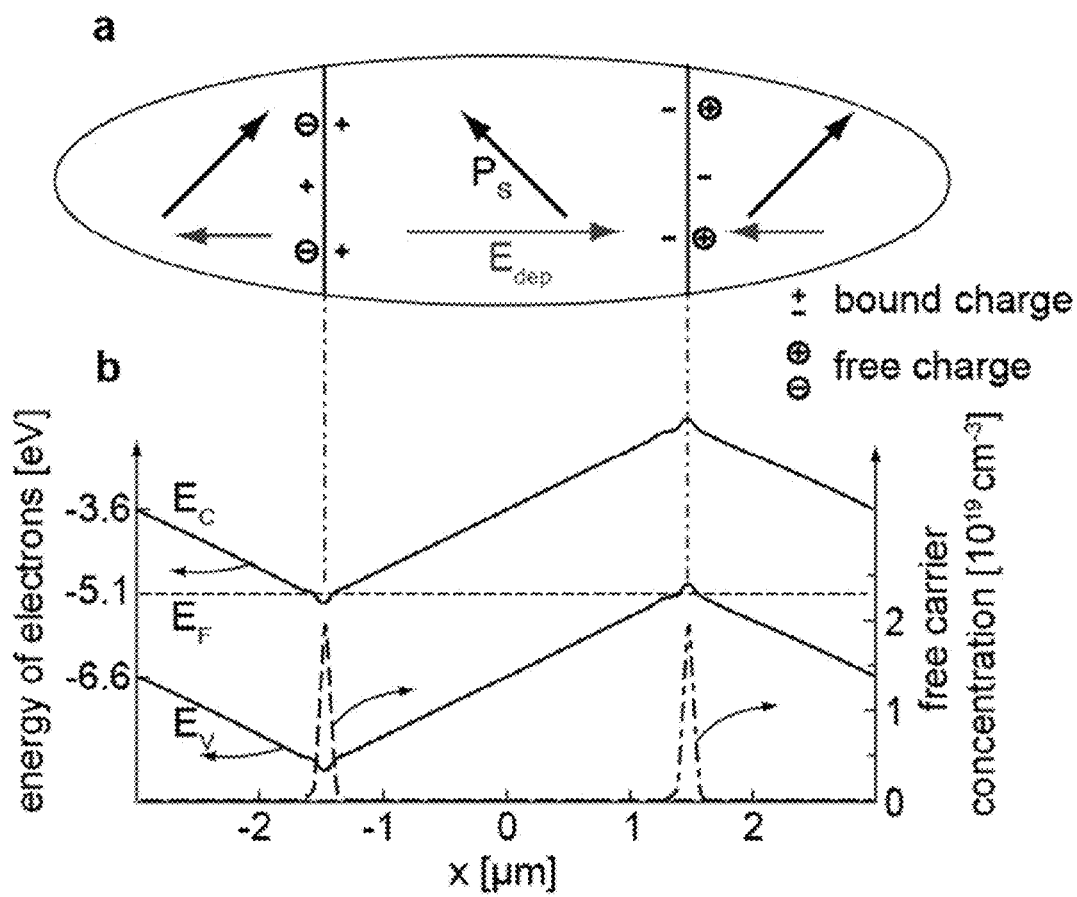
FIG. 5a shows a periodic structure of non-180° ferroelectric charged domain walls where bound polarization charge is almost perfectly compensated by free carriers.
FIG. 5b shows a phase field simulation result of band bending induced by the bound charge at 90° charged domain walls in ferroelectric $BaTiO_3$. The bound charge causes that the edges of the conduction band $E_C$ or valence band $E_V$ (solid black lines) to approach the Fermi level $E_F$ (dashed black line) where high concentrations of free electrons or holes (gray lines) are accumulated.

The elementary functional block in the described devices is a ferroelectric charged domain wall. FIG. 5*a* shows a two-dimensional schematic diagram of a ferroelectric material with two coexisting domain states identified by the orientation of a spontaneous polarization vector $P_S$. The boundaries between domains are ferroelectric charged domain walls. A head-to-head charged domain wall concentrates positive polarization charge and a tail-to-tail domain wall concentrates negative polarization charge. In the absence of defect compensation, the polarization charge at head-to-head domain walls is compensated by free electrons and at tail-to-tail charged domain walls by free holes forming a quasi-two-dimensional electron and hole gas, respectively. An example of the energy band diagram (left axis) with bending induced by the electrostatic charge in tetragonal ferroelectric $BaTiO_3$ and concentration (right axis) of free electrons (dashed line) and holes (dashed dotted line) is shown in FIG. 5*b* (details in Ref [6]). According to various embodiments, the charged domain walls which are not fully compensated by charged defects induce band bending and accumulation of free charge carriers. Quasi-two-dimensional charged domain walls locally convert the wide-bandgap semiconductor properties of the ferroelectric bulk (mostly assumed as an insulator) into a degenerate semiconductor.

Figure 6:
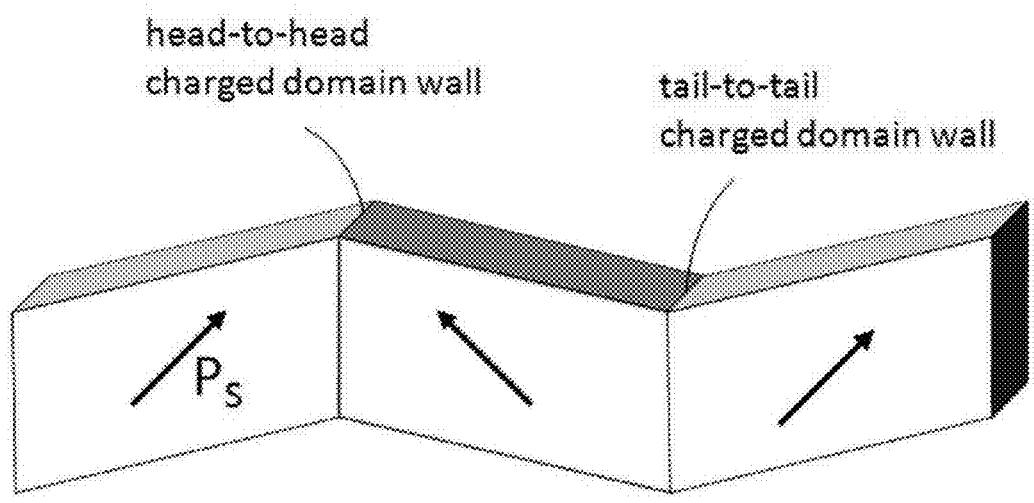
FIG. 6 illustrates stabilization of charged domain walls by elastic clamping of two distinct ferroelastic states. A domain wall between two ferroelastic domains minimizes its elastic energy when condition of elastic compatibility is satisfied. The elastic compatibility condition is defined by zero strain mismatch between domains at the domain wall.

The band bending created by charged domain walls (FIG. 5*b*) induces a depolarizing electric field ($E_{dep}$ in FIG. 5*a*)

across the adjacent domains. The force applied by the depolarizing field on ferroelectric domains has a destabilizing effect on charged domain walls. Thus, an additional stabilization factor which counterbalances the effect of the depolarizing field may be introduced. The stabilization of charged domain walls can be provided by pinning with compensating charged defects, but in this case, the domain wall properties do not necessarily display exceptional free carrier concentrations [7, 8]. FIG. 6 illustrates the stabilization of ferroelectric charged domain walls by ferroelastic clamping. Non-180° ferroelectric domain walls are usually also ferroelastic which means that the orientation of spontaneous strain changes at the domain wall. The minimum energy state of a ferroelastic domain wall is reached when its orientation and shape provides minimal strain mismatch between adjacent ferroelastic domains. The stabilization by ferroelastic clamping is only one possibility, other mechanisms may be applied. For example, an exotic family of domain walls was found in improper ferroelectrics $YMnO_3$ [9] and $ErMnO_3$ [10] where domain walls with a wide range of orientations, including stable charged configurations, are naturally locked. Tail-to-tail domain walls in $ErMnO_3$ displayed enhanced conductivity.

Figure 7:
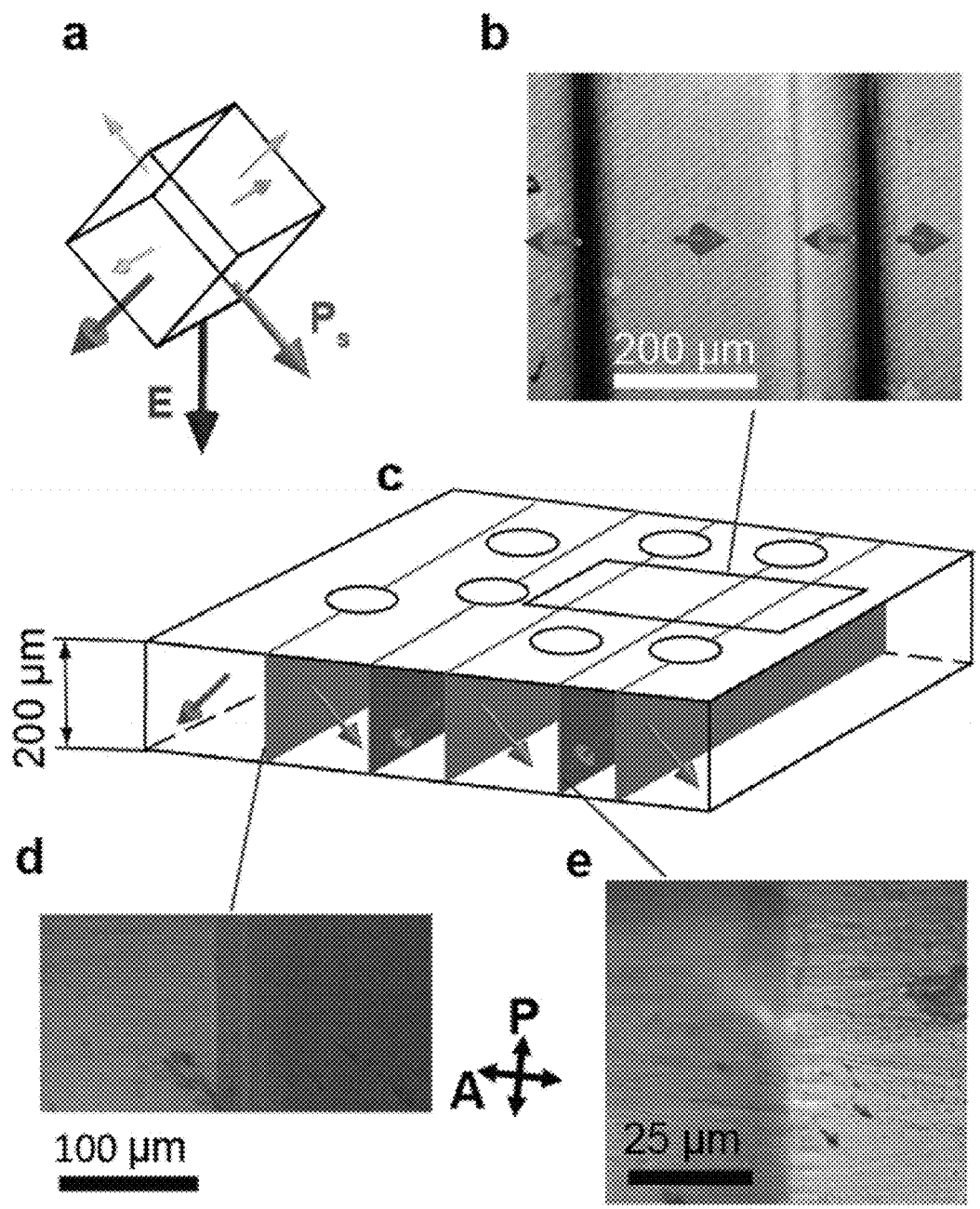
FIG. 7a shows poling of the crystal in a $[110]_c$-like direction (black arrow) in tetragonal $BaTiO_3$ which allows two equally preferred ferroelectric domain states (gray arrows) out of the six permitted (gray and white arrows).
FIG. 7b shows charged domain walls in a top view micrograph with light transmitted through the $BaTiO_3$ sample in the $[110]_c$ direction
FIG. 7c shows a non-scale diagram of a 200 μm thick ferroelectric sample with 5×5 mm² top-surface area. The domain walls are in reality irregularly distributed with periods from 100 to 300 μm.
FIG. 7d shows a tail-to-tail charged domain wall in a side view micrograph with light transmitted in the $[001]_c$ direction. P and A denote polarization of incident light and polarization filter on transmitted light, respectively.
FIG. 7e shows a head-to-head charged domain wall in a side view micrograph with light transmitted in the $[001]_c$ direction.

Hereafter, experimental evidence of charge domain wall properties in prototypical perovskite ferroelectric $BaTiO_3$ is described. While the description below refers to a specific example of material and procedure, in the general context of the invention, the material and procedure are not limited by this example. The sample may be a thin film or free crystal and the material can be any ferroic which exhibits the ferroelectric order parameter and allows charged domain wall formation. In the particular case, undoped $(110)_c$ plates of $BaTiO_3$ were cut into 5×5×0.5 mm³ pieces and lapped to 200 µm thickness with diamond grinding films of roughness from 15 to 0.1 µm. The samples, cleaned with acetone and isopropanol, were sputtered with 12 nm thick Pt electrodes on the $[110]_c$ surfaces. Samples were heated while being observed with a polarization microscope in transmitted light. Slow (~0.2° C./min) heating from 100° C. while switching on and off a voltage of 350 V (~1 switch/min) allows optical identification of (i) zero field and (ii) the field-induced phase transitions. After heating up to ~0.7° C. above the field-induced phase transition, the samples were cooled slowly (~0.1° C./min), without electric field, down to ~0.1° C. below the field-induced phase transition temperature. Then, a voltage of 350 V was rapidly applied inducing the phase transition and a periodic structure with $[1-10]_c$ planar charged domain walls. This process leads to charged domain wall formation, but is strongly sensitive to poling conditions, often creating walls which do not pass through the whole sample or form zig-zag-like neutral domain walls. The Pt electrode on the anode was removed using 1 µm diamond paste and replaced with sputtered 150 nm thick 200 µm diameter circular Pt electrodes with a 400 µm period. This configuration resulted in similar fractions of electrodes touching head-to-head, tail-to-tail or no domain walls (FIG. 7). By measuring charge transfer between the bottom and individual upper electrodes, one can clearly relate changes in the conductance to the presence of a charged domain wall.

Figure 8:
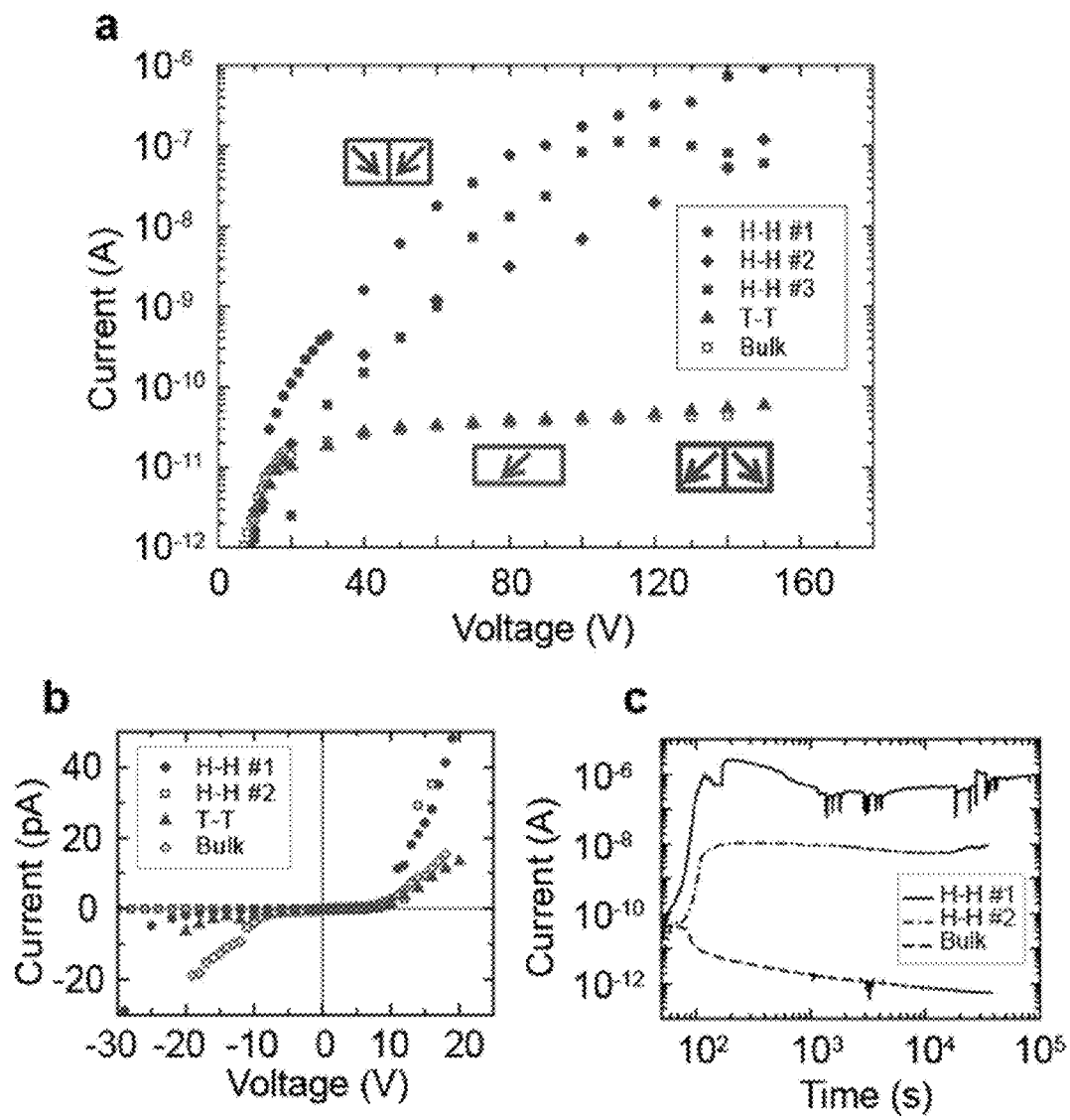
FIG. 8a shows semilogarithmic-scale room-temperature current-voltage characteristics of charged domain walls in $BaTiO_3$ and the bulk $BaTiO_3$. Conduction was up to $10^5$ times greater through electrodes touching head-to-head (H-H) charged domain walls than the conduction through the bulk or tail-to-tail (T-T) charged domain walls.
FIG. 8b shows linear current-voltage characteristics with a conduction threshold of 8 V indicating a tunneling junction between the Pt electrodes and ferroelectric $BaTiO_3$.
FIG. 8c shows the time dependence of the electric current through the $BaTiO_3$ bulk and head-to-head (H-H) charged domain walls when 100 V is applied across a 200 μm thick sample.

The conduction between electrodes connected by tail-to-tail charged domain walls was almost identical to the conduction through the bulk. The conduction between electrodes touching head-to-head charged domain wall was reproducibly and steadily (for >120 hours) $10^4$-$10^6$ times higher than conduction through the bulk, FIG. 8c. We confirmed this exclusive relation between head-to-head charged domain walls and giant conductivity by testing 30 different spots on ten different walls and on the bulk. FIGS. 8a and b show room-temperature current-voltage characteristics of the bulk and the cases when a single head-to-head or tail-to-tail charged domain wall is present between the tested electrodes.

At room-temperature, current-voltage characteristics between top-electrodes and the bottom electrode were measured with a Keithley 6517A electrometer. Measurements were conducted in a dark and electrically shielded box. Voltage was applied in steps and current was averaged between 60 and 70 s later. The current-temperature measurement was done in a DELTA 9023 chamber. Temperature was changed in steps, while voltage was kept constant at 100 V. Current was acquired when it fluctuated less than 10% for >10 s, then, current was averaged for 20 s.

FIG. 8b shows a conduction threshold at 8 V indicating a non-ohmic contact between the electrodes and the ferroelectric. Each datapoint in FIGS. 8a and b is acquired one minute after a step change of the applied voltage, hence, the values include transient currents shown on FIG. 8c. The steady difference between conductance measured with and without the head-to-head charged domain walls is more than six orders of magnitude (at V=100 V after >660 min), FIG. 8c. Assuming the thickness of a charged domain wall is 1 to 100 nm, its intrinsic conductivity is $10^8$-$10^{10}$ times higher than the conductivity of the bulk.

Strong evidence that the head-to-head charged domain walls are the objects providing free carriers for the measured current is seen at the tetragonal-orthorhombic and ferroelectric-paraelectric phase transitions, FIG. 9a. The 90° charged domain wall formed in tetragonal $BaTiO_3$ cannot exist in other phases due to their different symmetries as illustrated in the diagram in FIG. 9a. The electric current drops and rises by four to six orders of magnitude when cooling and heating, respectively, across the tetragonal-orthorhombic phase boundary at ~3° C.

Figure 9:
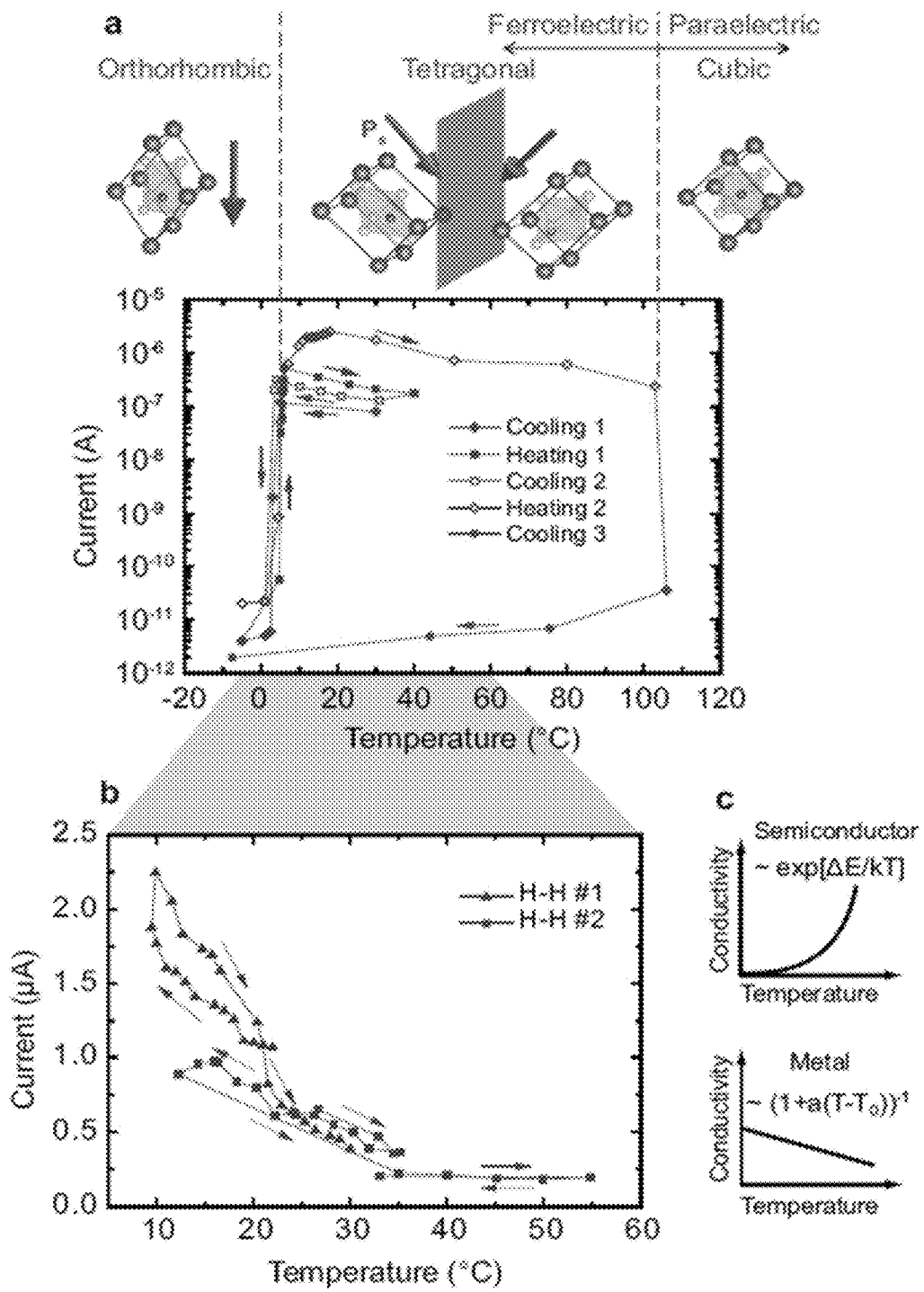
FIG. 9a shows the current-temperature dependence when a 90° head-to-head (H-H) charged domain wall is created and annihilated at phase transitions in $BaTiO_3$. The domain walls formed in tetragonal $BaTiO_3$ cannot exist in the orthorhombic and paraelectric phases as illustrated in the diagram. The charged domain wall is annihilated at both transitions from the tetragonal phase. The annihilation at the transition to the paraelectric phase is permanent in this case. The conductivity characteristics changes from a metallic-type temperature dependence and magnitude to a thermally activated conduction typical for a wide bandgap semiconductor like bulk $BaTiO_3$.
FIG. 9b shows linear current-temperature dependence with a pronounced positive temperature coefficient indicating thermally non-activated (i.e. metallic-type) conduction at charged domain walls.
FIG. 9c illustration of the difference between thermally activated (semiconductor-type) conduction and non-thermally activated (metallic-type) conduction.

When crossing the ferroelectric-paraelectric phase transition at ~110° C., FIG. 9a, the current drops to values typical for the bulk and remains such after cooling down to the tetragonal and orthorhombic phases. The charged domain walls under the measured electrodes are annihilated during the phase transition. All in all, the giant conductance was measured conclusively only when a head-to-head charged domain wall was present between the electrodes. The current-temperature characteristics, FIG. 9, show that the conduction through a head-to-head charged domain wall is not dominated by thermal activation like in semiconductors or ionic conductors, i.e. like in the $BaTiO_3$ bulk, but has the opposite, metallic-type trend with positive temperature coefficient, FIGS. 9b and c. Clearly the temperature dependence of charged domain wall conductivity is also influenced by the temperature dependence of spontaneous polarization and domain-wall width, but these factors would be minor relative to the exponential character of thermally activated conduction, if the latter were the dominant mechanism.

The observed absence of enhanced conductivity of tail-to-tail charged domain walls in the particular case described results from compensation by mobile oxygen vacancies (details introduced in [11]). In the absence of compensation by defects, tail-to-tail charged domain walls may form a quasi-two-dimensional hole gas and conduct as observed in $ErMnO_3$ [10].

Figure 10:
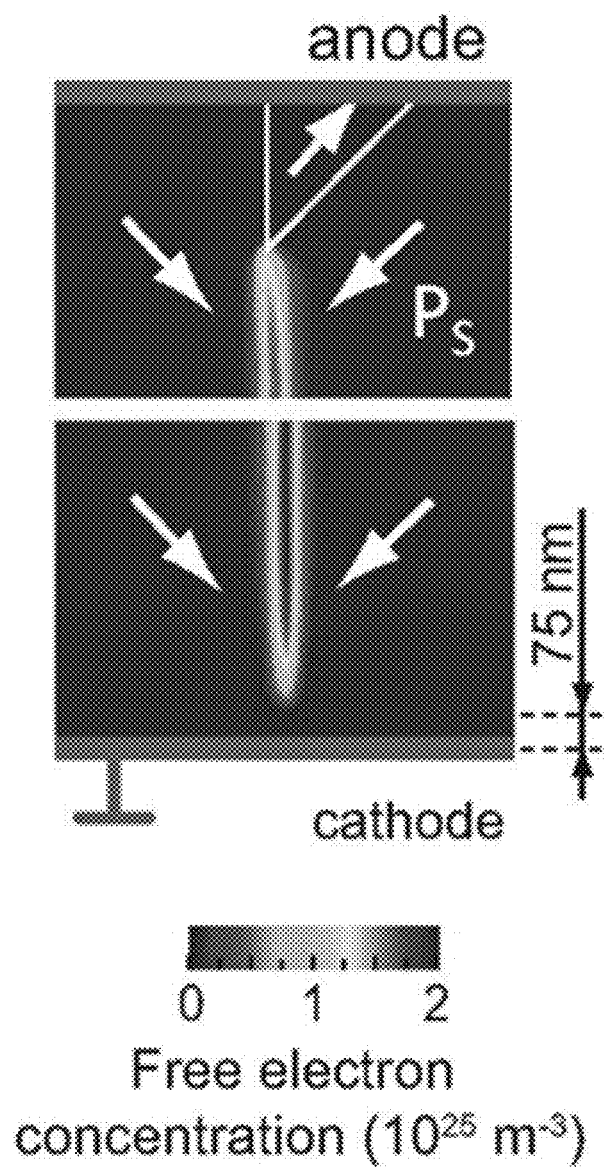
FIG. 10 shows phase field simulation results of the free electron concentration at head-to-head charged domain walls in $BaTiO_3$ in the vicinity of Pt electrodes.
Figure 11:
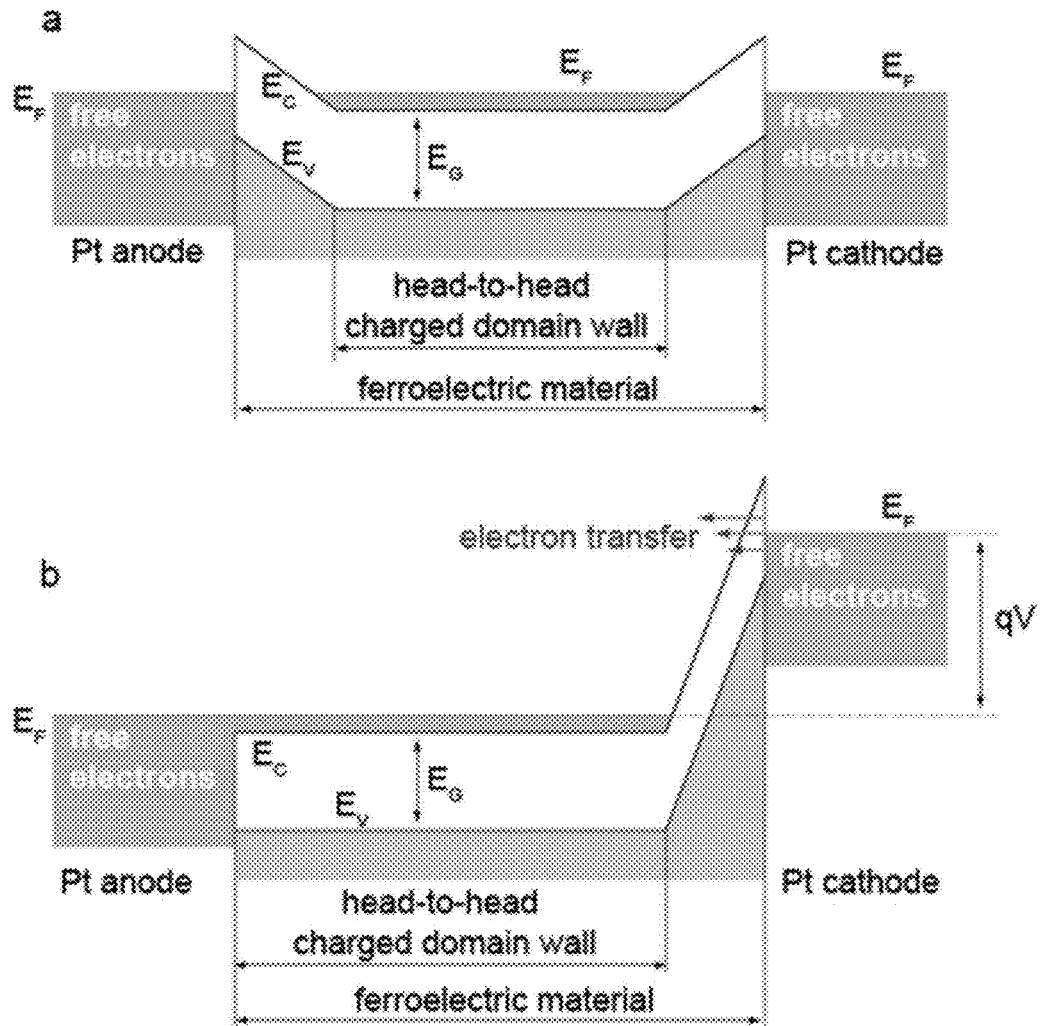
FIG. 11a shows a schematic of the band structure along a head-to-head charged domain wall in the vicinity of equipotential electrodes with an identical work function to the ferroelectric.
FIG. 11b shows the band diagram from FIG. 11a when a potential difference is applied between the electrodes.

At low voltages, the quasi-two-dimensional electron gas at head-to-head charged domain walls is separated from electrodes by an insulating wedge domain 11 at the anode 4 (FIGS. 1, 2 and 10) and an insulating gap at the cathode 1 or 3 as seen in phase field simulation results in FIG. 10 (details of method introduced in [11]) and as illustrated on the band diagram of the cross-section through a head-to-head charged domain wall in FIG. 11. The calculation results in FIG. 10 correspond to zero difference between the work-functions of the electrode and $BaTiO_3$, but it is qualitatively valid for the majority of conductors including Pt as used in the described experiment.

The insulating regions are formed due to the flattening of the electric potential by the equipotential electrodes. The mechanism is as follows: compensation of a charged domain wall requires band bending when the bottom of the conduction band, $E_C$, drops below the Fermi level, $E_F$, at a head-to-head charged domain wall (FIGS. 5b and 11) and the top of the valence band, $E_V$, rises over the Fermi level at a tail-to-tail charged domain wall, FIG. 5b. Recurring charged domain walls form built-in triangle-wave potential profiles (FIG. 5b) with amplitude equal to the $BaTiO_3$ bandgap. This cannot be satisfied by the electrodes which dictate the value of the potential, thus, the potential difference between charged domain walls and electrodes forms a transition region that is insulating and exposed to high electric field. This field has a depolarizing direction between the anode 4 and the head-to-head charged domain wall 7 which nucleates the wedge-like domain 11 or other anti-polar domain structures [6]. The electric field in the poling direction is applied across the insulating gap between a head-to-head charged domain wall 7 and the cathode (1 and 3) as shown in FIG. 11. This situation is inverted at tail-to-tail charged domain walls, i.e. the wedge domain is at the cathode and the insulating gap at the anode. In most cases, the conduction from the cathode (1 and 3) and the head-to-head charged domain wall can only be established when the reversely biased insulating gap at the cathode is penetrated by electrons (FIG. 11b). The applied voltage between anode and cathode drops almost entirely over the junction at the cathode, exposing the insulating gap to giant electric fields, theoretically up to ~$10^5$ V/mm when 10 V is applied. A lower bound conductivity estimate, given by sole Fowler-Nordheim tunneling through the insulating gap (method in [11]) reaches the experimentally measured values, i.e. ~$10^{-6}$ A at 100 V, when the barrier height is up to 2 V and the gap thickness is up to 90 nm, thus, providing sufficient current for realistic barrier parameters. This tunneling can be further enhanced by defect-assisted charge transfer mechanisms and by additional reduction of the barrier thickness due to the accumulation of oxygen vacancies that are usually present near the Pt electrodes. This might happen especially under poling fields which drive the positively charged oxygen vacancies towards the cathode. The accumulated defects narrow the barrier and provide empty energy states ~0.4 eV below the conduction band of $BaTiO_3$ for additional trap-assisted tunneling which might result in significantly higher charge transport than Fowler-Nordheim tunneling alone.

The insulating barriers between electrodes and either tail-to-tail or head-to-head charged domain walls can be reduced to zero in defect-free materials and form ohmic contacts if the electrode has a work-function, respectively, smaller or bigger than the work function of $BaTiO_3$ by more than half of the $BaTiO_3$ bandgap $E_G$, i.e. by more than ~1.5 V. Hence the contact between charged domain walls and electrodes can be ohmic, Schottky, or tunneling and is determined by the properties of the electrode material and the ferroelectric.

The device described in the invention does not necessarily employ charged domain wall conduction across the entire thickness of the ferroelectric layer. Only narrow charged domain walls 7 may be formed by the surface of the ferroelectric layer while neutral domain walls 8 can disconnect the charged domain wall 7 from the electrode 4. The device utilizes changes of impedance between the electrodes 1 and 3 when a charged domain wall 7 is formed, moved, or annihilated.

Figure 12:
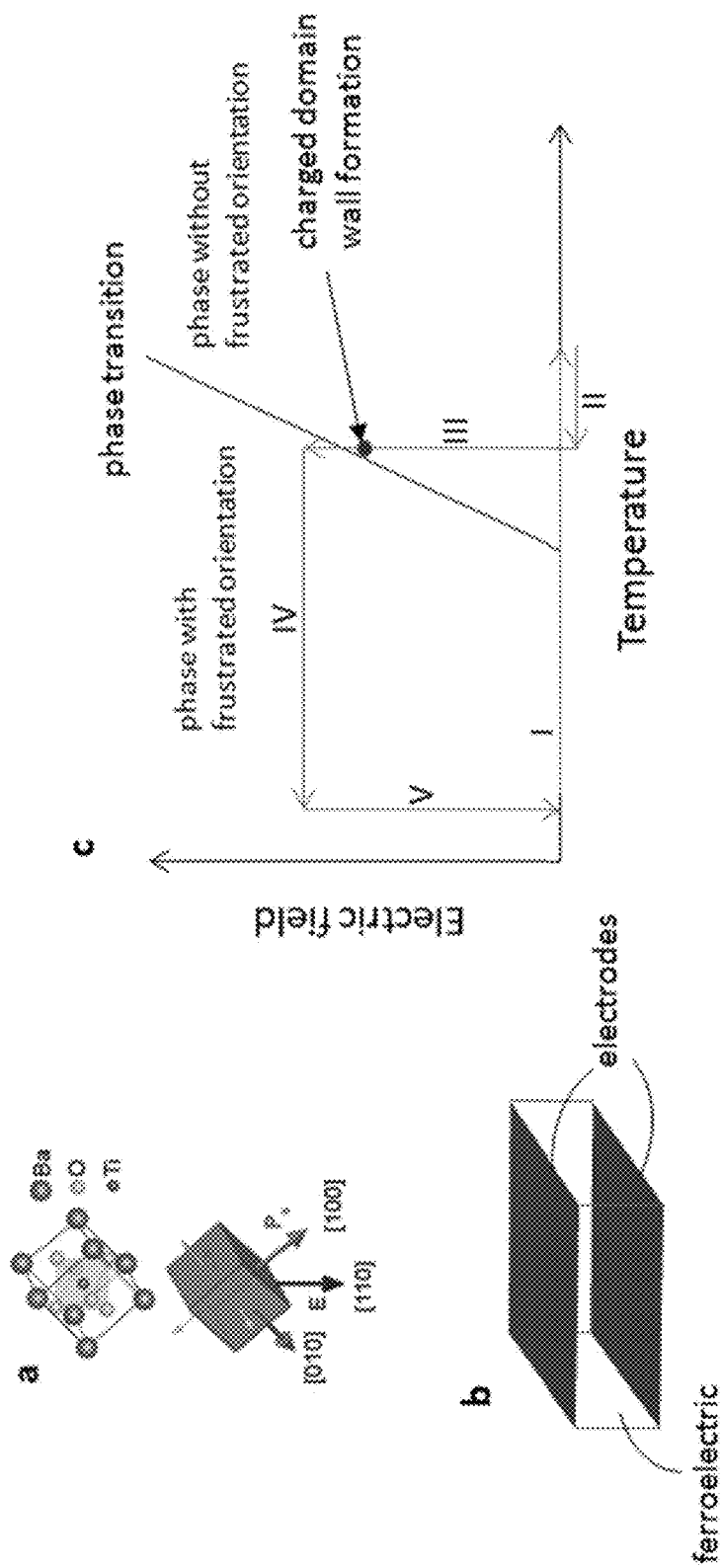

Additional options and conditions leading to charged domain wall formation are described hereafter. FIG. 12a shows an exemplar frustrated orientation between the ferroelectric crystal and poling field E. Frustrated poling occurs when E encloses the same angle with at least two possible polarization states, $P_S$, when the angle between E and $P_S$ is smaller than 90° and when there is no other polarization state with smaller angle enclosed by the electric field E. This poling prefers the polarization states $P_S$ (there are two such states in the example, but the number of states can in principle be higher). FIG. 12b displays a sample which creates an homogeneous electric field between electrodes. FIG. 12c shows a schematic diagram of the electric field/temperature path during frustrated poling. (I) The temperature is set to an initial value inside a phase which does not offer the frustrated configuration between ferroelectric states and the electric field; (II) The temperature is set to the position where changing the electric field can induce a phase transition into the phase with frustrated orientation; (III) The electric field is applied across the ferroelectric sample which induces the phase transition into the phase with frustrated orientation; (IV) Charged domain walls are stabilized with time while the electric field is still applied; (V) The electric field is released.

Figure 13:
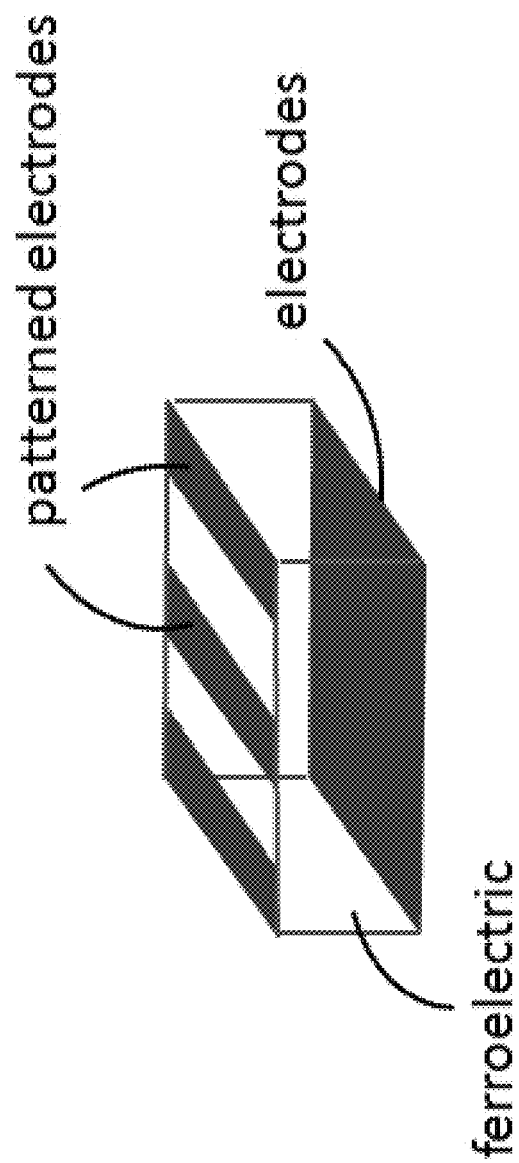
FIG. 13 shows a ferroelectric crystal plate in a frustrated orientation with patterned electrodes. The inhomogeneous electric field created by the patterned electrodes during frustrated poling described in FIG. 12c prefers different polarization states, $P_s$, depending on the local orientation of the electric field.

FIG. 13 shows a ferroelectric sample with patterned electrodes. The patterned electrodes create an inhomogeneous electric field which prefers different polarization states depending on the local orientation of the electric field. The patterned electrodes might be used with the same poling procedure as described in FIG. 12c and provide controlled formation of charged domain walls at locations defined by the electrode pattern.

Figure 14:
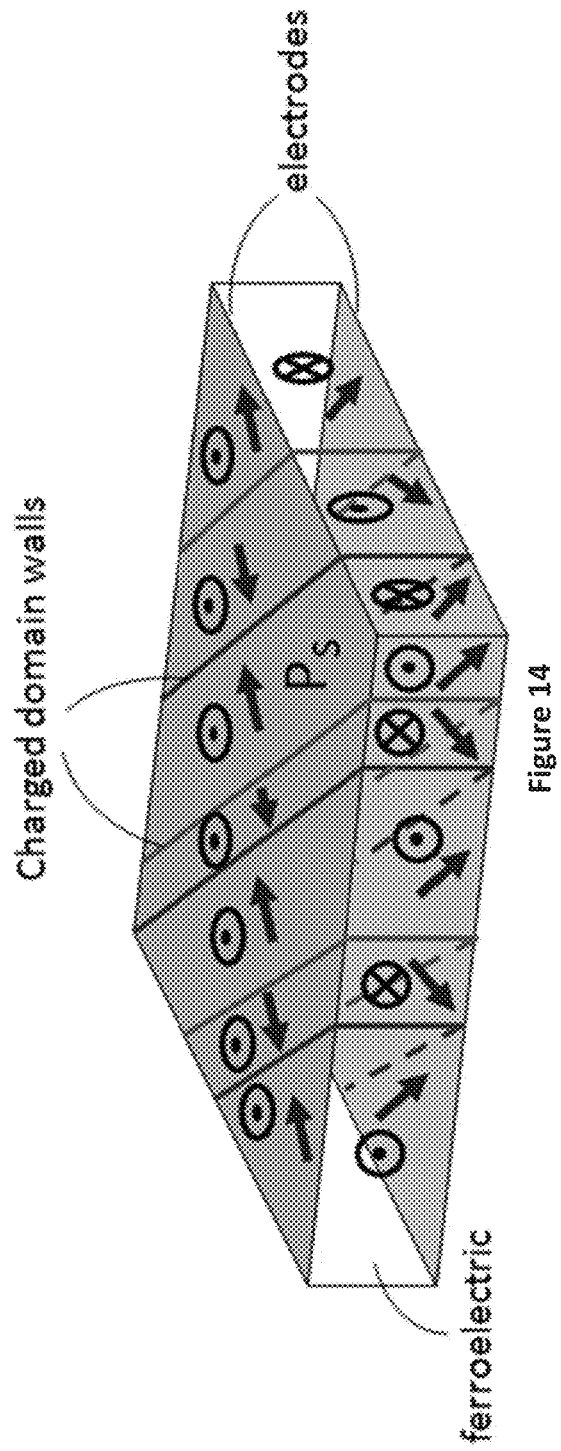
FIG. 14 shows the cut of the ferroelectric plate which has frustrated orientation in respect to all surface planes. The surface planes without electrodes contain uncompensated positive or negative polarization charge (circles with a dot denote polarization pointing into the crystal, circles with a cross denote polarization pointing out of the crystal).

FIG. 14 shows a cut sample with surfaces that all display frustrated orientation. When the sample is poled by the out-of-plane oriented electric field, the surfaces without electrodes contain uncompensated positive or negative polarization charge (circles with a dot represent polarization pointing into the crystal, circles with a cross represent polarization pointing out of the crystal). This polarization charge that appears during frustrated poling generates a depolarization field which is minimized when a periodic structure is created, hence, the sample exhibiting frustrated orientations on all of the non-electroded surfaces supports the formation of a periodic structure of charged domain walls.

Figure 15:
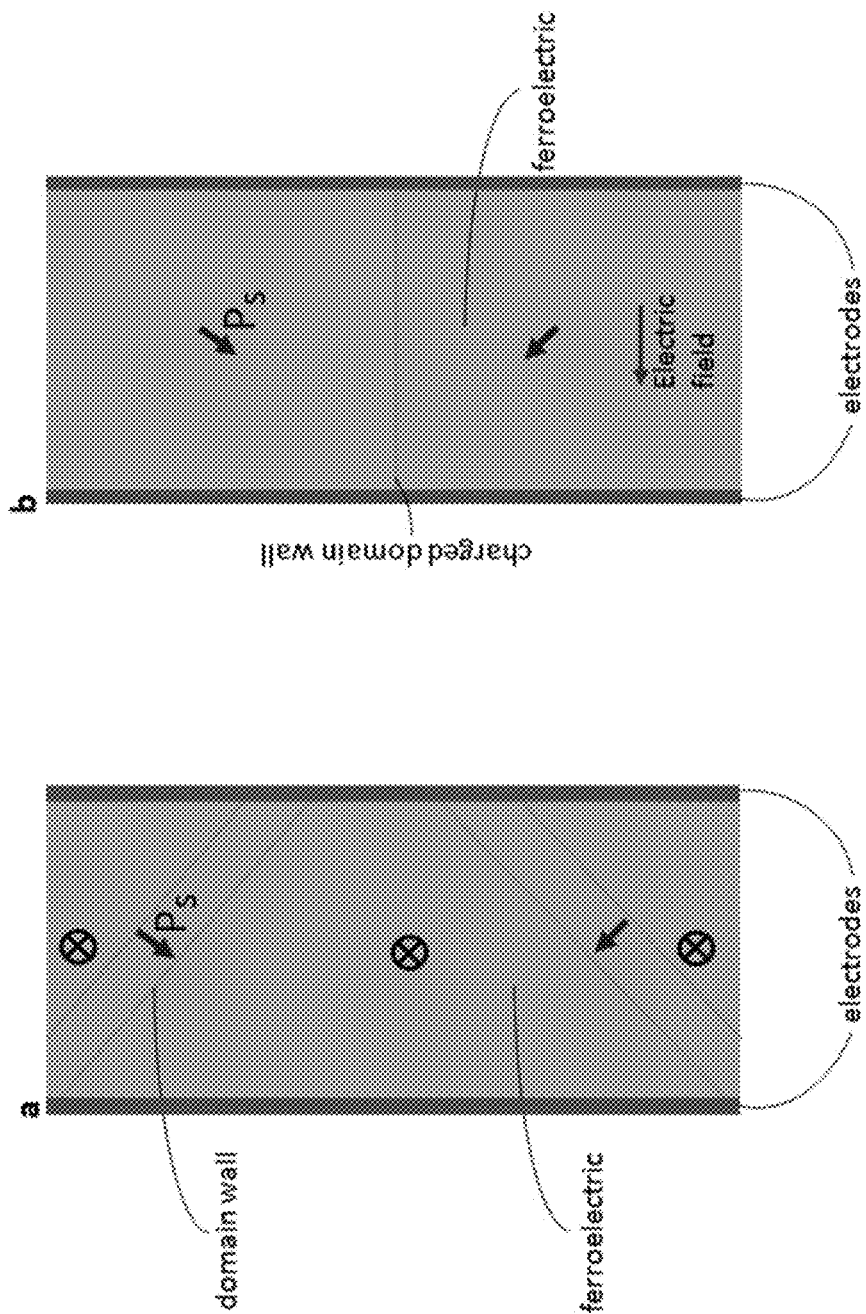
FIG. 15a illustrates a ferroelectric domain structure which includes at least two domains in the frustrated orientation with respect to the electric field produced by two parallel electrodes.
FIG. 15b illustrates the formation of charged domain walls by frustrated poling of the domain structure in FIG. 15a. The electric field E produced by the parallel electrodes erases the domains which have polarization other than any of the most preferred.

FIGS. 15 and 16 illustrate charged domain wall formation by poling of a random or artificially engineered domain structure with neutral domain walls. When the initial domain structure with neutral domain walls (FIGS. 15a and 16a) includes at least two domains which have frustrated orientation with respect to the electric field E, head-to-head (FIG. 15b) or tail-to-tail (FIG. 16b) charged domain walls are formed.

REFERENCES

[1] Mannhart J, Schlom D G. Oxide interfaces—an opportunity for electronics. Science 2010; 327.
[2] Ohtomo A, Hwang H Y. A high-mobility electron gas at the $LaAlO_3/SrTiO_3$ heterointerface. Nature 2004; 427.
[3] Thiel S, Hammen G, Schmehl A, Schneider C W, Mannhart J. Tunable quasi-two-dimensional electron gases in oxide heterostructures. Science 2006; 313.
[4] Vul B M, Guro G M, Ivanchik, I I. Encountering domains in ferroelectrics. Ferroelectrics 1973; 6:29.

[5] Gureev M Y, Tagantsev A K, Setter N. Head-to-head and tail-to-tail 180 degrees domain walls in an isolated ferroelectric. Physical Review B 2011; 83.
[6] Sluka T, Tagantsev A K, Damjanovic D, Gureev M, Setter N. Enhanced electromechanical response of ferroelectrics due to charged domain walls. Nat. Commun. 2012; 3:748.
[7] Schroeder M, Haussmann A, Thiessen A, Soergel E, Woike T, Eng L M. Conducting domain walls in lithium niobate single crystals. Adv. Funct. Mater. 2012; 22:3936.
[8] Kugel V D, Rosenman G. Domain inversion in heat-treated $LiNbO_3$ crystals. Appl. Phys. Lett. 1993; 62:2902.
[9] Choi T, Horibe Y, Yi H T, Choi Y J, Wu W, Cheong S W. Insulating interlocked ferroelectric and structural antiphase domain walls in multiferroic $YMnO_3$. Nat. Mater. 2010; 9.
[10] Meier D, Seidel J, Cano A, Delaney K, Kumagai Y, Mostovoy M, Spaldin N A, Ramesh R, Fiebig M. Anisotropic conductance at improper ferroelectric domain walls. Nat. Mater. 2012; 11.
[11] Sluka T, Tagantsev A, Bednyakov P, Setter N. Free-electron gas at charged domain walls in insulating $BaTiO_3$. Nat. Commun. 2013.

The invention claimed is:

1. A device comprising:
a ferroic material having a ferroelectric order parameter and including at least two domains;
a first and second electrode in electrical contact with the ferroic material;
wherein the device is configured to form a head-to-head polarization orientation or a tail-to-tail polarization orientation at an interface between the two domains to form a stable charged domain wall compensated by a free electron or hole gas at said interface and between the first and second electrodes.

2. The device according to claim 1, wherein the device is further configured to annihilate a head-to-head polarization orientation or a tail-to-tail polarization orientation at an interface between the two domains to annihilate the charged domain wall at said interface and between the first and second electrodes.

3. The device according to claim 1, wherein the device is further configured to spatially displace the charged domain wall within the ferroic material and outside the first and second electrodes to disable electrical contact with the first and second electrodes.

4. The device according to claim 1, wherein the device is configured to increase or decrease the amplitude of the charged domain wall formed at the interface of the two domains to provide field controlled impedance.

5. The device according to claim 1, wherein the ferroelectric material includes at least three domains forming two interconnected neutral domain walls, the charged domain wall being formed at an interconnection between the two interconnected domain walls.

6. The device according to claim 5, wherein the device is configured to control the size of one domain to form and annihilate the charged domain wall formed at the interface of the remaining two domains.

7. The device according to claim 1, wherein the device includes third and fourth electrodes arranged to apply an electric field to the ferroic material to form the charged domain wall.

8. The device according to claim 1, wherein the device includes fifth and sixth electrodes to spatially displace the charged domain wall within the ferroic material and outside the first and second electrodes.

9. The device according to claim 1, wherein the ferroic material includes charged domain walls that are 90.degree. domain walls, 71.degree. domain walls or 109.degree. domain walls, or a combination of any of these domain walls.

10. A switch comprising the device according to claim 1.

11. A memory comprising the device according to claim 1.

12. A device including a ferroic material having a ferroelectric order parameter, at least two domains, a head-to-head polarization orientation or a tail-to-tail polarization orientation at an interface between the two domains forming a stable charged domain wall compensated by a free electron or hole gas at said interface.

* * * * *